(12) United States Patent
Pi et al.

(10) Patent No.: US 11,595,031 B1
(45) Date of Patent: Feb. 28, 2023

(54) CIRCUIT AND METHOD FOR ELIMINATING SPURIOUS SIGNAL

(71) Applicant: NEWCOSEMI (BEIJING) TECHNOLOGY CO., LTD, Beijing (CN)

(72) Inventors: Deyi Pi, Beijing (CN); Gongbao Cheng, Beijing (CN)

(73) Assignee: NEWCOSEMI (BEIJING) TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 17/457,790

(22) Filed: Dec. 6, 2021

(30) Foreign Application Priority Data

Aug. 10, 2021 (CN) .......................... 202110912822.7

(51) Int. Cl.
*H03K 5/1252* (2006.01)
*G06F 1/08* (2006.01)
*H03L 7/08* (2006.01)
*H03K 5/00* (2006.01)

(52) U.S. Cl.
CPC ............. *H03K 5/1252* (2013.01); *G06F 1/08* (2013.01); *H03L 7/08* (2013.01); *H03K 2005/00286* (2013.01)

(58) Field of Classification Search
None
See application file for complete search history.

(56) References Cited

U.S. PATENT DOCUMENTS

| | | | |
|---|---|---|---|
| 6,384,589 B1 | 5/2002 | Gumm et al. | |
| 9,397,675 B1* | 7/2016 | Goodson | H03M 3/50 |
| 10,056,912 B1 | 8/2018 | Bu et al. | |
| 10,819,353 B1* | 10/2020 | Monk | H03L 7/23 |
| 11,356,083 B1* | 6/2022 | Nediyanchath | H03K 5/01 |
| 2006/0181354 A1 | 8/2006 | Kegasa et al. | |

(Continued)

FOREIGN PATENT DOCUMENTS

| | | |
|---|---|---|
| CN | 1773971 | 5/2006 |
| CN | 104931968 | 9/2015 |

(Continued)

OTHER PUBLICATIONS

Chinese Office Action cited in 202110912822.7 dated Jan. 13, 2022.

(Continued)

*Primary Examiner* — Cassandra F Cox
(74) *Attorney, Agent, or Firm* — Workman Nydegger

(57) ABSTRACT

A circuit and a method for eliminating a spurious signal are provided. The circuit includes a phase detector, a spurious estimation and regeneration device, and a phase shifter. After an actual clock signal containing a spurious signal is obtained, the contained spurious signal is estimated based on the reference clock signal that does not contain the spurious signal. Reverse adjustment is performed on the actual clock signal based on the estimated spurious signal to eliminate the spurious signal in the actual clock signal, ensuring eliminating the generated spurious signal by performing reverse adjustment, improving the signal transmission quality, thereby solving the problem of reduced signal quality due to that the spurious signal cannot be suppressed in generation according to the conventional technology.

9 Claims, 3 Drawing Sheets

(56) References Cited

U.S. PATENT DOCUMENTS

| | | | |
|---|---|---|---|
| 2009/0206893 A1* | 8/2009 | Terauchi | ................... H03L 7/18 327/156 |
| 2017/0288851 A1 | 10/2017 | Avivi et al. | |
| 2020/0195258 A1 | 6/2020 | Avivi et al. | |

FOREIGN PATENT DOCUMENTS

| | | |
|---|---|---|
| CN | 107276586 | 10/2017 |
| CN | 109600772 | 4/2019 |
| CN | 110622420 | 12/2019 |
| CN | 111585548 | 8/2020 |

OTHER PUBLICATIONS

Jinshan, Yue, et al., "Fractional Spur Reduction Techniques in Fractional-N Frequency Synthesizer", Journal of Solid-State Circuits, 2003.

Ho, Cheng-Ru, et al., "A Digital PLL with Feedforward Multi-Tone Spur Cancellation Scheme Achieving <-76 dBc Fractional Supr and <-110 dBc Reference Spur in 65 nm CMOS", IEE Journal of Solid-State Circuits, 2016.

\* cited by examiner

CIRCUIT AND METHOD FOR ELIMINATING SPURIOUS SIGNAL

The present application claims the priority to Chinese Patent Application No. 202110912822.7, titled "CIRCUIT AND METHOD FOR ELIMINATING SPURIOUS SIGNAL", filed on Aug. 10, 2021 with the Chinese Patent Office, which is incorporated herein by reference in its entirety.

FIELD

The present disclosure relates to the technical field of electronic circuits, and in particular to a circuit and a method for eliminating a spurious signal.

BACKGROUND

In a communication system, a spurious signal usually exists between radio frequency signals, generating spurious interference, reducing the signal-to-noise ratio of the communication system, and thereby reducing the communication quality.

To solve this problem, a method for suppressing generation of a spurious signal is usually used to avoid the interference of the spurious signal. However, with the method, the generated spurious signal can only be attenuated, and the generation of the spurious signal cannot be suppressed.

SUMMARY

In view of the above, a circuit and a method for eliminating a spurious signal are provided according to the present disclosure. The technical solutions are as follows.

A circuit for eliminating a spurious signal, includes a phase detector, a spurious estimation and regeneration device, and a phase shifter.

The phase detector is configured to obtain an actual clock signal and a reference clock signal, and compare the actual clock signal with the reference clock signal to obtain a phase difference signal. The actual clock signal contains the spurious signal, and the reference clock signal does not contain the spurious signal.

The spurious estimation and generation device is connected to the phase detector, and is configured to obtain the phase difference signal and generate a theoretical spurious signal based on the phase difference signal.

The phase shifter is connected to the spurious estimation and regeneration device, and is configured to perform reverse adjustment on the actual clock signal based on the theoretical spurious signal to obtain an output clock signal in which the spurious signal is eliminated by performing the reverse adjustment and to output the output clock signal.

In an embodiment, the circuit further includes a phase locked loop. The phase locked loop is connected to the phase detector, and is configured to obtain the reference clock signal and generate, based on the reference clock signal, the actual clock signal containing the spurious signal.

In an embodiment, an input terminal of the phase locked loop is connected to an input terminal of the phase detector, so that the phase detector obtains the reference clock signal inputted to the phase locked loop. An output terminal of the phase locked loop is connected to an input terminal of the phase detector, so that the phase detector obtains the actual clock signal outputted by the phase locked loop.

In an embodiment, the output terminal of the phase locked loop is connected to an input terminal of the phase shifter, so that the phase shifter obtains the actual clock signal outputted by the phase locked loop to perform adjustment on the actual clock signal.

In an embodiment, the spurious estimation and regeneration device includes a band-pass filter. The band-pass filter is configured to filter the phase difference signal to obtain the theoretical spurious signal.

In an embodiment, the spurious estimation and regeneration device includes a spurious estimation device and a spurious regeneration device. The spurious estimation device is connected to the phase detector, and is configured to generate an estimated spurious signal based on the phase difference signal outputted by the phase detector. The spurious regeneration device is connected to the spurious estimation device, and is configured to generate the theoretical spurious signal based on the estimated spurious signal.

In an embodiment, the spurious estimation device is a frequency-phase tracker, and the spurious regeneration device is a frequency-phase generator.

A method for eliminating a spurious signal, includes: obtaining an actual clock signal and a reference clock signal, where the actual clock signal contains the spurious signal, and the reference clock signal does not contain the spurious signal; comparing the actual clock signal with the reference clock signal to obtain a phase difference signal; generating a theoretical spurious signal based on the phase difference signal; and performing reverse adjustment on the actual clock signal based on the theoretical spurious signal to obtain an output clock signal in which the spurious signal is eliminated by performing the reverse adjustment, and outputting the output clock signal.

In an embodiment, the obtaining an actual clock signal and a reference clock signal includes: obtaining the reference clock signal; and generating, by a phase locked loop based on the reference clock signal, the actual clock signal containing the spurious signal.

In an embodiment, the generating a theoretical spurious signal based on the phase difference signal includes: filtering, by a band-pass filter, the phase difference signal to obtain the theoretical spurious signal.

It can be seen from the above solutions that, a circuit and a method for eliminating a spurious signal are provided according to the present disclosure. The circuit includes a phase detector, a spurious estimation and regeneration device, and a phase shifter. The phase detector is configured to obtain an actual clock signal and a reference clock signal, and compare the actual clock signal with the reference clock signal to obtain a phase difference signal, where the actual clock signal contains the spurious signal, and the reference clock signal does not contain the spurious signal. The spurious estimation and regeneration device is connected to the phase detector, and is configured to obtain the phase difference signal and generate a theoretical spurious signal based on the phase difference signal. The phase shifter is connected to the spurious estimation and regeneration device, and is configured to perform adjustment on the actual clock signal based on the theoretical spurious signal to obtain an output clock signal in which the spurious signal is eliminated by performing the adjustment and output the output clock signal. According to the solutions in the present disclosure, after the actual clock signal containing the spurious signal is obtained, the spurious signal is estimated based on the reference clock signal that does not contain the spurious signal, and reverse adjustment is performed on the actual clock signal based on the estimated spurious signal to eliminate the spurious signal in the actual clock signal, ensuring eliminating the generated spurious signal by performing reverse adjustment, improving the signal transmission quality, thereby solving the problem of reduced signal quality due to that the spurious signal cannot be suppressed in generation according to the conventional technology.

BRIEF DESCRIPTION OF THE DRAWINGS

For clearer illustration of the technical solutions according to embodiments of the present disclosure or according to the conventional technology, the drawings to be used in the description of the embodiments or the conventional technology are briefly described below. Apparently, the drawings in the following descriptions show only some embodiments of the present disclosure, and other drawings may be obtained by those skilled in the art according to the drawings without any creative effort.

DETAILED DESCRIPTION

The technical solutions in the embodiments of the present disclosure are clearly and completely described in the following with reference to the accompanying drawings in the embodiments of the present disclosure. Apparently, the embodiments described herein are only a part rather than all of the embodiments of the present disclosure. Any other embodiments obtained by those skilled in the art based on the embodiments in the present disclosure without any creative effort shall fall within the protection scope of the present disclosure.

Figure 1:
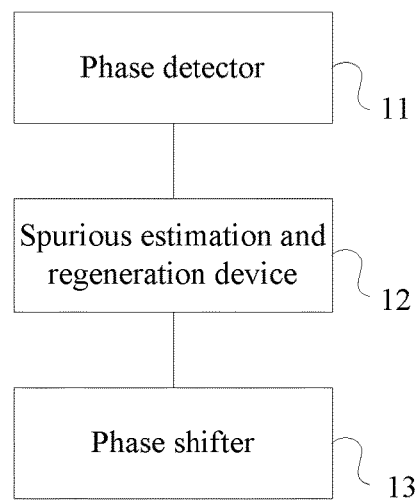
FIG. 1 is a schematic diagram of a circuit for eliminating a spurious signal according to an embodiment of the present disclosure.

A circuit for eliminating a spurious signal is provided according to an embodiment of the present disclosure. FIG. 1 shows a schematic diagram of a circuit for eliminating a spurious signal according to an embodiment of the present disclosure. As shown in FIG. 1, the circuit includes a phase detector 11, a spurious estimation and regeneration device 12, and a phase shifter 13.

The phase detector 11 is configured to obtain an actual clock signal and a reference clock signal, and compare the actual clock signal with the reference clock signal to obtain a phase difference signal. The actual clock signal contains the spurious signal, and the reference clock signal does not contain the spurious signal.

The spurious estimation and regeneration device 12 is connected to the phase detector 11, and is configured to obtain the phase difference signal and generate a theoretical spurious signal based on the phase difference signal.

The phase shifter 13 is connected to the spurious estimation and regeneration device 12, and is configured to perform reverse adjustment on the actual clock signal based on the theoretical spurious signal to obtain an output clock signal in which the spurious signal is eliminated by performing the reverse adjustment and output the output clock signal.

In a communication system, in a case that a spurious signal exists between radio frequency signals, the signal-to-noise ratio of the communication system is reduced, thereby deteriorating the communication quality. To avoid the interference of the spurious signal, a method for suppressing generation of a spurious signal is usually adopted to reduce the generation of the spurious signal. However, according to the conventional technology, the spurious signal cannot be completely suppressed and the spurious signal is still generated, that is, the communication quality is still affected by the generated spurious signal.

According to the solutions in the embodiments of the present disclosure, the spurious signal is eliminated after generated, so that no spurious signal exists in the transmission of the radio frequency signals after all the generated spurious signals are eliminated, ensuring that there is no interference from any spurious signal in the transmission of the radio frequency signals, and thereby improving the communication quality.

The circuit for eliminating a spurious signal disclosed according to the embodiment at least includes a phase detector, a spurious estimation and regeneration device, and a phase shifter.

The phase detector includes at least two input terminals. An actual clock signal is obtained via a first input terminal, and a reference clock signal is obtained via a second input terminal. The phase detector further includes an output terminal. The output terminal is connected to an input terminal of the spurious estimation and regeneration device. The output terminal of the spurious estimation and regeneration device is connected to an input terminal of the phase shifter.

The phase shifter includes at least two input terminals. A first input terminal of the phase shifter is connected to the output terminal of the spurious estimation and regeneration device to obtain an output signal from the spurious estimation and regeneration device. The actual clock signal is obtained via a second input terminal of the phase shifter, and the second input terminal may be connected to the first input terminal of the phase detector. The phase detector obtains the actual clock signal via the first input terminal and the phase shifter obtains the actual clock signal via the second input terminal synchronously. Thus, after the phase detector obtains the actual clock signal and a device subsequently determines a spurious signal, the phase shifter eliminates the spurious signal contained in the initially obtained actual clock signal to obtain a clock signal that does not contain the spurious signal, transmitting radio frequency signals in which the spurious signal is eliminated, thereby ensuring communication sensitivity.

After obtaining the actual clock signal that contains the spurious signal and the reference clock signal that does not contain the spurious signal, the phase detector compares the actual clock signal and the reference clock signal to determine a phase difference between the actual clock signal and the reference clock signal and outputs a phase difference signal.

The phase difference outputted by the phase detector is a difference between the actual clock signal and the reference clock signal caused by the spurious signal in the actual clock signal. The phase difference is an instantaneous phase difference. The spurious signal interferes with the clock signal, causing the phase of the clock signal to change. In an ideal situation, that is, in a case without any spurious signal, the clock signal has a regular and periodic waveform. In a case that the clock signal is interfered by a spurious signal, the waveform of the clock signal fluctuates and deviates from the position in the ideal situation.

After the phase detector outputs the phase difference, the spurious estimation and regeneration device obtains the phase difference signal. The spurious estimation and regeneration device estimates and generates, based on the phase difference signal, a theoretical spurious signal, that is, a theoretical spurious signal.

Generally, since the theoretical spurious signal is generated based on the actual clock signal and the reference clock signal, the theoretical spurious signal is the same as the spurious signal in the actual clock signal.

After the spurious estimation and regeneration device generates the theoretical spurious signal, the phase shifter may perform reverse adjustment on the previously obtained actual clock signal to eliminate the spurious signal in the actual clock signal. After eliminating the spurious signal in the actual clock signal, the phase shifter outputs a clock signal that does not contain the spurious signal. That is, the output clock signal outputted finally is a clock signal in which the spurious signal is eliminated, thereby avoiding the influence of the spurious signal on the radio frequency signal and improving the communication quality.

Figure 2:
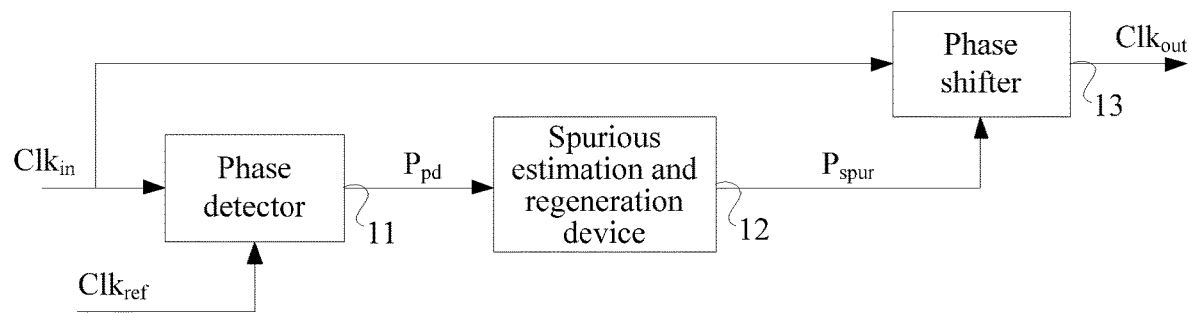
FIG. 2 is a schematic diagram showing signal transmission in a circuit for eliminating a spurious signal according to an embodiment of the present disclosure.

FIG. 2 is a schematic diagram showing signal transmission in a circuit for eliminating a spurious signal according to an embodiment of the present disclosure. FIG. 2 shows a phase detector 11, a spurious estimation and regeneration device 12, a phase shifter 13, an actual clock signal $Clk_{in}$, a reference clock signal $Clk_{ref}$, a phase difference signal $P_{pd}$, a theoretical spurious signal $P_{spur}$, and an output clock signal $Clk_{out}$.

The actual clock signal $Clk_{in}$ and the reference clock signal $Clk_{ref}$ are inputted to the phase detector via different input terminals of the phase detector. The phase detector compares the actual clock signal $Clk_{in}$ with the reference clock signal $Clk_{ref}$, and outputs the phase difference signal $P_{pd}$. The phase difference signal $P_{pd}$ is inputted to the spurious estimation and regeneration device, and the spurious estimation and regeneration device generates the theoretical spurious signal $P_{spur}$. Then, the theoretical spurious signal $P_{spur}$ and the actual clock signal $Clk_{in}$ are inputted to the phase shifter, and the phase shifter outputs the output clock signal $Clk_{out}$ in which the spurious signal is eliminated.

The frequency of the actual clock signal $Clk_{in}$ may be the same as or different from the frequency of the reference clock signal $Clk_{ref}$.

The circuit for eliminating a spurious signal according to the embodiments of the present disclosure includes a phase detector, a spurious estimation and regeneration device, and a phase shifter. The phase detector is configured to obtain an actual clock signal and a reference clock signal, and compare the actual clock signal with the reference clock signal to obtain a phase difference signal. The actual clock signal contains a spurious signal, and the reference clock signal does not contain the spurious signal. The spurious estimation and regeneration device is connected to the phase detector, and is configured to obtain the phase difference signal and generate a theoretical spurious signal based on the phase difference signal. The phase shifter is connected to the spurious estimation and regeneration device, and is configured to perform adjustment on the actual clock signal based on the theoretical spurious signal to obtain an output clock signal in which the spurious signal is eliminated by performing the adjustment and output the output clock signal.

According to the solutions in the embodiment, after the actual clock signal containing the spurious signal is obtained, the spurious signal is estimated based on the reference clock signal that does not contain the spurious signal, and reverse adjustment is performed on the actual clock signal based on the estimated spurious signal to eliminate the spurious signal contained in the actual clock signal, ensuring eliminating the generated spurious signal by performing reverse adjustment, improving the signal transmission quality, thereby solving the problem of reduced signal quality due to that the spurious signal cannot be suppressed in generation according to the conventional technology.

Figure 3:
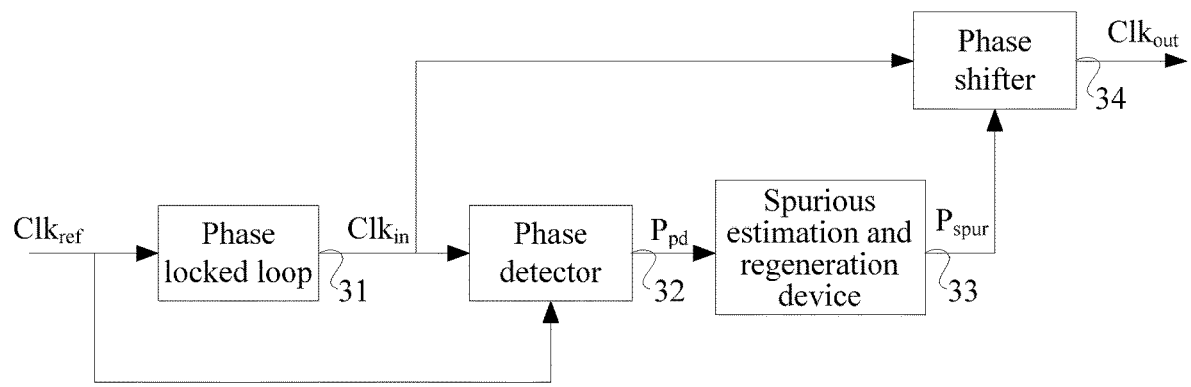
FIG. 3 is a schematic diagram of a circuit for eliminating a spurious signal according to an embodiment of the present disclosure.

A circuit for eliminating a spurious signal is further provided according to an embodiment of the disclosure. FIG. 3 shows a schematic diagram of a circuit for eliminating a spurious signal according to an embodiment of the present disclosure. As shown in FIG. 3, the circuit includes a phase locked loop 31, a phase detector 32, a spurious estimation and regeneration device 33, and a phase shifter 34.

Based on the structure of the circuit in the above embodiment, a phase locked loop 31 is added in the circuit according to the embodiment.

The phase locked loop 31 is connected to the phase detector, and is configured to obtain the reference clock signal and generate, based on the reference clock signal, the actual clock signal containing the spurious signal.

The phase detector is configured to compare the actual clock signal with the reference clock signal to determine the phase difference between the actual clock signal and the reference clock signal. Before the phase detector obtains the actual clock signal and the reference clock signal, the phase locked loop may perform processing first.

Only one input, that is, the reference clock signal, is inputted to the circuit for eliminating a spurious signal according to the embodiment of the present disclosure. The reference clock signal is obtained by the phase locked loop. After obtaining the reference clock signal, the phase locked loop generates the actual signal containing the spurious signal based on the reference clock signal. The phase locked loop inputs the generated actual clock signal to the phase detector. The phase detector obtains the original reference clock signal via the other input terminal of the phase detector, so that the phase detector compares the phases of the actual clock signal and the reference clock signal.

The phase locked loop performs processing on the reference clock signal to adjust the frequency of the reference clock signal, so that the signal outputted by the phase locked loop meets a desired frequency, that is, a clock signal meeting a frequency requirement is obtained. The clock signal with the desired frequency is used as an input clock signal, that is, the actual clock signal, for the circuit.

Since the actual clock signal is obtained based on the reference clock signal and the frequency of the reference clock signal is adjusted by the phase locked loop, the frequency of the actual clock signal is different from the frequency of the reference clock signal.

In an embodiment, since the phase shifter is configured to perform reverse adjustment on the actual clock signal to eliminate the spurious signal in the actual clock signal, the phase locked loop, after generating the actual clock signal based on the reference clock signal, transmits the generated actual clock signal via an output terminal of the phase locked loop to the phase shifter and the spurious estimation and regeneration device. Then, the phase shifter adjusts the actual clock signal and outputs a clock signal in which the spurious signal is eliminated.

The circuit for eliminating a spurious signal according to the embodiments of the present disclosure includes a phase detector, a spurious estimation and regeneration device, and a phase shifter. The phase detector is configured to obtain an actual clock signal and a reference clock signal, and compare the actual clock signal with the reference clock signal to obtain a phase difference signal. The actual clock signal contains a spurious signal, and the reference clock signal does not contain the spurious signal. The spurious estimation and regeneration device is connected to the phase detector, and is configured to obtain the phase difference signal and generate a theoretical spurious signal based on the phase difference signal. The phase shifter is connected to the spurious estimation and regeneration device, and is configured to perform adjustment on the actual clock signal based on the theoretical spurious signal to obtain an output clock signal in which the spurious signal is eliminated by performing the adjustment and output the output clock signal. According to the solutions in the embodiment, after the actual clock signal containing the spurious signal is obtained, the spurious signal is estimated based on the reference clock signal that does not contain the spurious signal, and reverse adjustment is performed on the actual clock signal based on the estimated spurious signal to eliminate the spurious signal contained in the actual clock signal, ensuring eliminating the generated spurious signal by performing reverse adjustment, improving the signal transmission quality, thereby solving the problem of reduced signal quality due to that the spurious signal cannot be suppressed in generation according to the conventional technology.

In an embodiment, on the basis of the above embodiments, the spurious estimation and regeneration device may be a band-pass filter.

The band-pass filter is used as the spurious estimation and regeneration device. The band-pass filter performs filtering processing to obtain the theoretical spurious signal.

In practical applications, in a case that a spurious signal in a frequency band has a high intensity, a band-pass filter with a bandwidth corresponding to the frequency band is selected to perform filtering processing to obtain the spurious signal.

That is, in the case that the band-pass filter is used as the spurious estimation and regeneration device, the spurious estimation and regeneration device does not only include one band-pass filter corresponding to a frequency band, the spurious estimation and regeneration device may include multiple band-pass filters corresponding to different frequency bands. Thus, for each of the frequency bands, in a case that a spurious signal in the frequency band has a high intensity, a filter corresponding to the frequency band may be selected to perform filtering processing.

It should be noted that the spurious estimation and regeneration device may include a band-pass filter in a case that the frequency of the actual clock signal is the same as the frequency of the reference clock signal.

However, in a case that the frequency of the actual clock signal is different from the frequency of the reference clock signal, the spurious estimation and regeneration device cannot be implemented by using the band-pass filter, and is implemented by using a spurious estimation device and a spurious regeneration device.

The spurious estimation device is connected to the phase detector and is configured to generate an estimated spurious signal based on the phase difference signal outputted by the phase detector. The spurious regeneration device is connected to the spurious estimation device, and is configured to generate the theoretical spurious signal based on the estimated spurious signal.

That is, in the case that the frequency of the actual clock signal is different from the frequency of the reference clock signal, it is required to use two devices to respectively perform spurious signal estimation and spurious signal regeneration, and then to generate the theoretical spurious signal.

Figure 4:
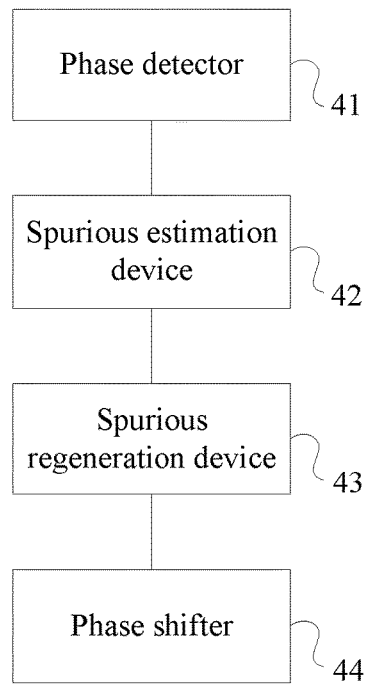
FIG. 4 is a schematic diagram of a circuit for eliminating a spurious signal according to an embodiment of the present disclosure.

FIG. 4 shows a schematic diagram of a circuit for eliminating a spurious signal according to an embodiment of the present disclosure. As shown in FIG. 4, the circuit includes a phase detector 41, a spurious estimation device 42, a spurious regeneration device 43, and a phase shifter 44.

The spurious estimation device may be a frequency-phase tracker, and the spurious regeneration device may be a frequency-phase generator.

In the case that the spurious estimation and regeneration device includes the spurious estimation device and the spurious regeneration device, the frequency of the actual clock signal may be the same as or different from the frequency of reference clock signal. That is, in this case, it is unnecessary to limit the frequencies of the actual clock signal and the reference clock signal.

In the case that the spurious estimation and regeneration device only includes the band-pass filter, it is required that the frequency of the actual clock signal is the same as the frequency of the reference clock signal.

The circuit for eliminating a spurious signal according to the embodiments of the present disclosure includes a phase detector, a spurious estimation and regeneration device, and a phase shifter. The phase detector is configured to obtain an actual clock signal and a reference clock signal, and compare the actual clock signal with the reference clock signal to obtain a phase difference signal. The actual clock signal contains a spurious signal, and the reference clock signal does not contain the spurious signal. The spurious estimation and regeneration device is connected to the phase detector, and is configured to obtain the phase difference signal and generate a theoretical spurious signal based on the phase difference signal. The phase shifter is connected to the spurious estimation and regeneration device, and is configured to perform adjustment on the actual clock signal based on the theoretical spurious signal to obtain an output clock signal in which the spurious signal is eliminated by performing the adjustment and output the output clock signal. According to the solutions in the embodiments, after the actual clock signal containing the spurious signal is obtained, the spurious signal is estimated based on the reference clock signal that does not contain the spurious signal, and reverse adjustment is performed on the actual clock signal based on the estimated spurious signal to eliminate the spurious signal contained in the actual clock signal, ensuring eliminating the generated spurious signal by performing reverse adjustment, improving the signal transmission quality, thereby solving the problem of reduced signal quality due to that the spurious signal cannot be suppressed in generation according to the conventional technology.

Figure 5:
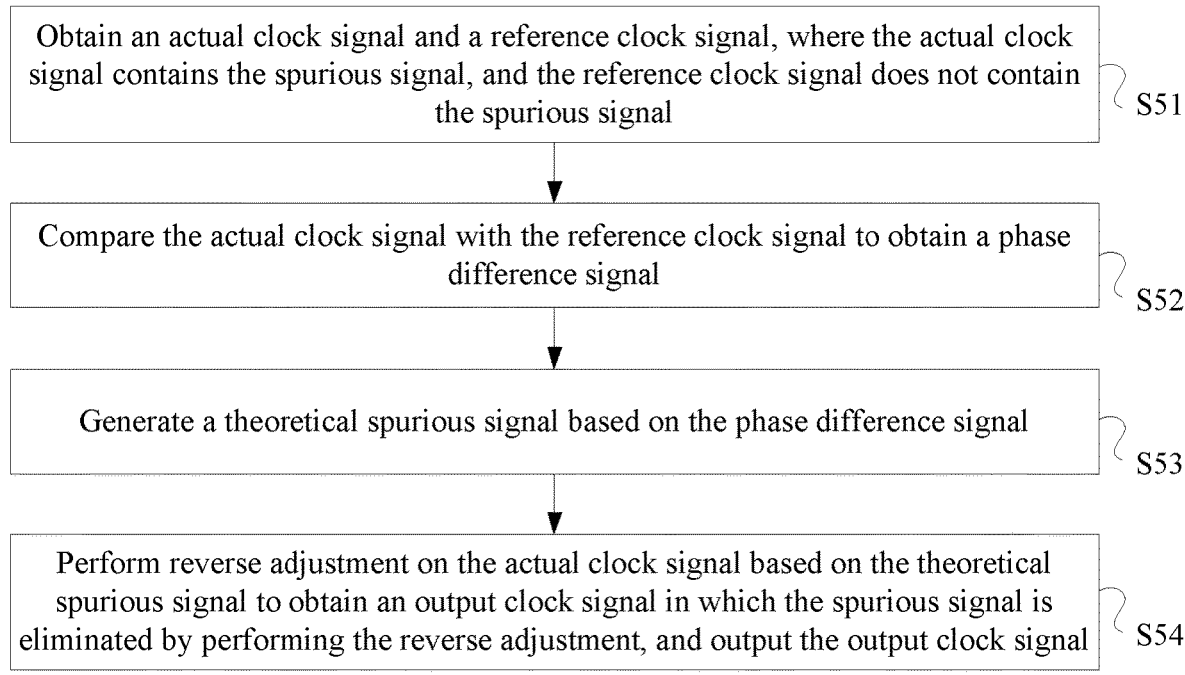
FIG. 5 is a flowchart of a method for eliminating a spurious signal according to an embodiment of the present disclosure.

A method for eliminating a spurious signal is provided according to an embodiment of the present disclosure. FIG. 5 shows a flowchart of a method for eliminating a spurious signal according to an embodiment of the present disclosure. As shown in FIG. 5, the method includes the following steps S51 to S54.

In step S51, an actual clock signal and a reference clock signal are obtained, where the actual clock signal contains the spurious signal, and the reference clock signal does not contain the spurious signal.

In step S52, the actual clock signal is compared with the reference clock signal to obtain a phase difference signal.

In step S53, a theoretical spurious signal is generated based on the phase difference signal.

In step S54, reverse adjustment is performed on the actual clock signal based on the theoretical spurious signal to obtain an output clock signal in which the spurious signal is eliminated by performing the reverse adjustment, and the output clock signal is outputted.

In a communication system, in a case that a spurious signal exists between radio frequency signals, the signal-to-noise ratio of the communication system is reduced, thereby deteriorating the communication quality. To avoid the interference of the spurious signal, a method for suppressing generation of a spurious signal is usually adopted to reduce the generation of the spurious signal. However, according to the conventional technology, the spurious signal cannot be completely suppressed and the spurious signal is still generated, that is, the communication quality is still affected by the generated spurious signal.

According to the solutions in the embodiments of the present disclosure, the spurious signal is eliminated after generated, so that no spurious signal exists in the transmission of the radio frequency signals after all the generated spurious signals are eliminated, ensuring that there is no interference from any spurious signal in the transmission of the radio frequency signals, and thereby improving the communication quality.

The circuit for eliminating a spurious signal disclosed according to the embodiment at least includes a phase detector, a spurious estimation and regeneration device, and a phase shifter.

The phase detector includes at least two input terminals. An actual clock signal is obtained via a first input terminal, and a reference clock signal is obtained via a second input terminal. The phase detector further includes an output terminal. The output terminal is connected to an input terminal of the spurious estimation and regeneration device. The output terminal of the spurious estimation and regeneration device is connected to an input terminal of the phase shifter.

The phase shifter includes at least two input terminals. A first input terminal of the phase shifter is connected to the output terminal of the spurious estimation and regeneration device to obtain an output signal from the spurious estimation and regeneration device. The actual clock signal is obtained via a second input terminal of the phase shifter, and the second input terminal may be connected to the first input terminal of the phase detector. The phase detector obtains the actual clock signal via the first input terminal and the phase shifter obtains the actual clock signal via the second input terminal synchronously. Thus, after the phase detector obtains the actual clock signal and a device subsequently determines a spurious signal, the phase shifter eliminates the spurious signal contained in the initially obtained actual clock signal to obtain a clock signal that does not contain the spurious signal, transmitting radio frequency signals in which the spurious signal is eliminated, thereby ensuring communication sensitivity.

After obtaining the actual clock signal that contains the spurious signal and the reference clock signal that does not contain the spurious signal, the phase detector compares the actual clock signal and the reference clock signal to determine a phase difference between the actual clock signal and the reference clock signal and outputs a phase difference signal.

The phase difference outputted by the phase detector is a difference between the actual clock signal and the reference clock signal caused by the spurious signal in the actual clock signal. The phase difference is an instantaneous phase difference. The spurious signal interferes with the clock signal, causing the phase of the clock signal to change. In an ideal situation, that is, in a case without any spurious signal, the clock signal has a regular and periodic waveform. In a case that the clock signal is interfered by a spurious signal, the waveform of the clock signal fluctuates and deviates from the position in the ideal situation.

After the phase detector outputs the phase difference, the spurious estimation and regeneration device obtains the phase difference signal. The spurious estimation and regeneration device estimates and generates, based on the phase difference signal, a theoretical spurious signal, that is, a theoretical spurious signal.

Generally, since the theoretical spurious signal is generated based on the actual clock signal and the reference clock signal, the theoretical spurious signal is the same as the spurious signal in the actual clock signal.

After the spurious estimation and regeneration device generates the theoretical spurious signal, the phase shifter may perform reverse adjustment on the previously obtained actual clock signal to eliminate the spurious signal in the actual clock signal. After eliminating the spurious signal in the actual clock signal, the phase shifter outputs a clock signal that does not contain the spurious signal. That is, the output clock signal outputted finally is a clock signal in which the spurious signal is eliminated, thereby avoiding the influence of the spurious signal on the radio frequency signal and improving the communication quality.

FIG. 2 is a schematic diagram showing signal transmission in a circuit for eliminating a spurious signal according to an embodiment of the present disclosure. FIG. 2 shows a phase detector 11, a spurious estimation and regeneration device 12, a phase shifter 13, an actual clock signal $Clk_{in}$, a reference clock signal $Clk_{ref}$, a phase difference signal $P_{pd}$, a theoretical spurious signal $P_{spur}$, and an output clock signal $Clk_{out}$.

The actual clock signal $Clk_{in}$ and the reference clock signal $Clk_{ref}$ are inputted to the phase detector via different input terminals of the phase detector. The phase detector compares the actual clock signal $Clk_{in}$ with the reference clock signal $Clk_{ref}$, and outputs the phase difference signal $P_{pd}$. The phase difference signal $P_{pd}$ is inputted to the spurious estimation and regeneration device, and the spurious estimation and regeneration device generates the theoretical spurious signal $P_{spur}$. Then, the theoretical spurious signal $P_{spur}$ and the actual clock signal $Clk_{in}$ are inputted to the phase shifter, and the phase shifter outputs the output clock signal $Clk_{out}$ in which the spurious signal is eliminated.

The frequency of the actual clock signal $Clk_{in}$, may be the same as or different from the frequency of the reference clock signal $Clk_{ref}$.

In an embodiment, the process of obtaining an actual clock signal and a reference clock signal may include: obtaining the reference clock signal, and generating, by a phase locked loop based on the reference clock signal, the actual clock signal containing the spurious signal.

The phase detector is configured to compare the actual clock signal with the reference clock signal to determine the phase difference between the actual clock signal and the reference clock signal. Before the phase detector obtains the actual clock signal and the reference clock signal, the phase locked loop may perform processing first.

Only one input, that is, the reference clock signal, is inputted to the circuit where the method for eliminating a spurious signal according to the embodiment of the present disclosure is applied. The reference clock signal is obtained by the phase locked loop. After obtaining the reference clock signal, the phase locked loop generates the actual signal containing the spurious signal based on the reference clock signal. The phase locked loop inputs the generated actual clock signal to the phase detector. The phase detector obtains the original reference clock signal via the other input terminal of the phase detector, so that the phase detector compares the phases of the actual clock signal and the reference clock signal.

The phase locked loop performs processing on the reference clock signal to adjust the frequency of the reference clock signal, so that the signal outputted by the phase locked loop meets a desired frequency, that is, a clock signal meeting a frequency requirement is obtained. The clock signal with the desired frequency is used as an input clock signal, that is, the actual clock signal, for the circuit.

Since the actual clock signal is obtained based on the reference clock signal and the frequency of the reference clock signal is adjusted by the phase locked loop, the frequency of the actual clock signal is different from the frequency of the reference clock signal.

In an embodiment, since the phase shifter is configured to perform reverse adjustment on the actual clock signal to eliminate the spurious signal in the actual clock signal, the phase locked loop, after generating the actual clock signal based on the reference clock signal, transmits the generated the actual clock signal via an output terminal of the phase locked loop to the phase shifter and the spurious estimation and regeneration device. Then, the phase shifter adjusts the actual clock signal and outputs a clock signal in which the spurious signal is eliminated.

In an embodiment, on the basis of the above embodiments, the spurious estimation and regeneration device may be a band-pass filter.

The band-pass filter is used as the spurious estimation and regeneration device. The band-pass filter performs filtering processing to obtain the theoretical spurious signal.

In practical applications, in a case that a spurious signal in a frequency band has a high intensity, a band-pass filter with a bandwidth corresponding to the frequency band is selected to perform filtering processing to obtain the spurious signal.

That is, in the case that the band-pass filter is used as the spurious estimation and regeneration device, the spurious estimation and regeneration device does not only include one band-pass filter corresponding to a frequency band, the spurious estimation and regeneration device may include multiple band-pass filters corresponding to different frequency bands. Thus, for each of the frequency bands, in a case that a spurious signal in the frequency band has a high intensity, a filter corresponding to the frequency band may be selected to perform filtering processing.

It should be noted that the spurious estimation and regeneration device may include a band-pass filter in a case that the frequency of the actual clock signal is the same as the frequency of the reference clock signal.

However, in a case that the frequency of the actual clock signal is different from the frequency of the reference clock signal, the spurious estimation and regeneration device cannot be implemented by using the band-pass filter, and is implemented by using a spurious estimation device and a spurious regeneration device.

The spurious estimation device is connected to the phase detector and is configured to generate an estimated spurious signal based on the phase difference signal outputted by the phase detector. The spurious regeneration device is connected to the spurious estimation device, and is configured to generate the theoretical spurious signal based on the estimated spurious signal.

That is, in the case that the frequency of the actual clock signal is different from the frequency of the reference clock signal, it is required to use two devices to respectively perform spurious signal estimation and spurious signal regeneration, and then to generate the theoretical spurious signal.

FIG. 4 shows a schematic diagram of a circuit for eliminating a spurious signal according to an embodiment of the present disclosure. As shown in FIG. 4, the circuit includes a phase detector 41, a spurious estimation device 42, a spurious regeneration device 43, and a phase shifter 44.

The spurious estimation device may be a frequency-phase tracker, and the spurious regeneration device may be a frequency-phase generator.

In the case that the spurious estimation and regeneration device includes the spurious estimation device and the spurious regeneration device, the frequency of the actual clock signal may be the same as or different from the frequency of reference clock signal. That is, in this case, it is unnecessary to limit the frequencies of the actual clock signal and the reference clock signal.

In the case that the spurious estimation and regeneration device only includes the band-pass filter, it is required that the frequency of the actual clock signal is the same as the frequency of the reference clock signal.

In the method for eliminating a spurious signal according to the embodiments of the present disclosure, an actual clock signal and a reference clock signal are obtained, and a phase difference signal is obtained by comparing the actual clock signal with the reference clock signal, where the actual clock signal contains the spurious signal, and the reference clock signal does not contain the spurious signal; a theoretical spurious signal is generated based on the phase difference signal; and adjustment is performed on the actual clock signal based on the theoretical spurious signal to obtain an output clock signal in which the spurious signal is eliminated by performing the adjustment, and the output clock signal is outputted. According to the solutions in the embodiments, after the actual clock signal containing the spurious signal is obtained, the spurious signal is estimated based on the reference clock signal that does not contain the spurious signal, and reverse adjustment is performed on the actual clock signal based on the estimated spurious signal to eliminate the spurious signal contained in the actual clock signal, ensuring eliminating the generated spurious signal by performing reverse adjustment, improving the signal transmission quality, thereby solving the problem of reduced signal quality due to that the spurious signal cannot be suppressed in generation according to the conventional technology.

The embodiments in this specification are described in a progressive manner, each of the embodiments emphasizes the differences between the embodiment and other embodiments, and the same or similar parts among the embodiments may be referred to each other. Since device embodiments are similar to method embodiments, the description thereof is relatively simple, and related explanations may be referred to the descriptions of the method embodiments.

It may be known by those skilled in the art that units and steps in each method described in combination with the disclosed embodiments may be realized by electronic hardware, computer software or a combination thereof. In order to clearly describe interchangeability of the hardware and the software, steps and composition of each of the embodiments are generally described in view of functions in the above specification. Whether the functions are executed in hardware way or in a software way depends on application of the technical solution and design constraint condition. Those skilled in the art may use different method for each application to realize the described function, and this is not be considered to be beyond the scope of the application.

The steps of the method or algorithm described in conjunction with the embodiments of the present disclosure may be implemented by hardware, software modules executed by a processor, or a combination thereof. The software modules may reside in a random access memory (RAM), an internal memory, a read only memory (ROM), an electrically programmable ROM, an electrically-erasable programmable ROM, a register, a hard disk, a removable disk drive, a CD-ROM, or any other types of storage medium well known in the technical field.

Those skilled in the art may implement or practice the present disclosure based on the above descriptions of the disclosed embodiments. Various modifications to these embodiments are apparent for those skilled in the art. The general principles defined in the present disclosure may be implemented in other embodiments without departing from the spirit and scope of the present disclosure. Therefore, the present disclosure should not be limited to the embodiments disclosed herein, but conforms to the widest scope consistent with the principle and novel features disclosed in the specification.

The invention claimed is:

1. A circuit for eliminating a spurious signal, comprising:
   a phase detector, configured to obtain an actual clock signal and a reference clock signal, and compare the actual clock signal with the reference clock signal to obtain a phase difference signal, wherein the actual clock signal contains the spurious signal, and the reference clock signal does not contain the spurious signal;
   a spurious estimation and regeneration device, connected to the phase detector, and configured to obtain the phase difference signal and generate a theoretical spurious signal based on the phase difference signal; and
   a phase shifter, connected to the spurious estimation and regeneration device, and configured to perform reverse adjustment on the actual clock signal based on the theoretical spurious signal to obtain an output clock signal in which the spurious signal is eliminated by performing the reverse adjustment and to output the output clock signal;
   wherein the spurious estimation and regeneration device comprises:
   a spurious estimation device, connected to the phase detector, and configured to generate an estimated spurious signal based on the phase difference signal outputted by the phase detector; and
   a spurious regeneration device, connected to the spurious estimation device, and configured to generate the theoretical spurious signal based on the estimated spurious signal.

2. The circuit according to claim 1, further comprising:
   a phase locked loop, connected to the phase detector, configured to obtain the reference clock signal and generate, based on the reference clock signal, the actual clock signal containing the spurious signal.

3. The circuit according to claim 2, wherein:
   an input terminal of the phase locked loop is connected to an input terminal of the phase detector, wherein the phase detector obtains the reference clock signal inputted to the phase locked loop; and
   an output terminal of the phase locked loop is connected to an input terminal of the phase detector, wherein the phase detector obtains the actual clock signal outputted by the phase locked loop.

4. The circuit according to claim 2, wherein:
   the output terminal of the phase locked loop is connected to an input terminal of the phase shifter, wherein the phase shifter obtains the actual clock signal outputted by the phase locked loop to perform adjustment on the actual clock signal.

5. The circuit according to claim 1, wherein the spurious estimation and regeneration device comprises:
   a band-pass filter, configured to filter the phase difference signal to obtain the theoretical spurious signal.

6. The circuit according to claim 1, wherein:
   the spurious estimation device is a frequency-phase tracker; and
   the spurious regeneration device is a frequency-phase generator.

7. A method for eliminating a spurious signal, comprising:
   obtaining an actual clock signal and a reference clock signal, wherein the actual clock signal contains the spurious signal, and the reference clock signal does not contain the spurious signal;
   comparing the actual clock signal with the reference clock signal to obtain a phase difference signal;
   generating a theoretical spurious signal based on the phase difference signal; and
   performing reverse adjustment on the actual clock signal based on the theoretical spurious signal to obtain an output clock signal in which the spurious signal is eliminated by performing the reverse adjustment, and outputting the output clock signal;
   wherein the generating a theoretical spurious signal based on the phase difference signal comprises:
   generating an estimated spurious signal based on the phase difference signal; and
   generating the theoretical spurious signal based on the estimated spurious signal.

8. The method according to claim 7, wherein the obtaining an actual clock signal and a reference clock signal comprises:
   obtaining the reference clock signal; and
   generating, by a phase locked loop based on the reference clock signal, the actual clock signal containing the spurious signal.

9. The method according to claim 7, wherein the generating a theoretical spurious signal based on the phase difference signal comprises:
   filtering, by a band-pass filter, the phase difference signal to obtain the theoretical spurious signal.

* * * * *